(12) United States Patent
Antonakopoulos et al.

(10) Patent No.: US 7,646,693 B2
(45) Date of Patent: Jan. 12, 2010

(54) DATA OVERWRITING IN PROBE-BASED DATA STORAGE DEVICES

(75) Inventors: Theodore Antonakopoulos, Patras (GR); Evangelos S. Eleftheriou, Zurich (CH); Haris Pozidis, Gattikon (CH)

(73) Assignee: International Business Machines Corporation, Armonk, NY (US)

( * ) Notice: Subject to any disclaimer, the term of this patent is extended or adjusted under 35 U.S.C. 154(b) by 674 days.

(21) Appl. No.: 11/015,823

(22) Filed: Dec. 17, 2004

(65) Prior Publication Data

US 2005/0122786 A1    Jun. 9, 2005

Related U.S. Application Data

(63) Continuation of application No. PCT/IB03/02542, filed on Jun. 13, 2003.

(30) Foreign Application Priority Data

Jun. 27, 2002  (EP)  .................................. 02405541

(51) Int. Cl.
  *G11B 7/00* (2006.01)
(52) U.S. Cl. .................................... 369/59.24; 369/126

(58) Field of Classification Search .................. None
See application file for complete search history.

(56) References Cited

U.S. PATENT DOCUMENTS 7,099,257 B2 *  8/2006  Antonakopoulos et al. ....... 369/59.24

FOREIGN PATENT DOCUMENTS

| EP | 0 718 831 A2 | 6/1996 |
|----|--------------|--------|
| EP | 0 991 060 A2 | 4/2000 |
| EP | 1 056 077 A2 | 11/2000 |

OTHER PUBLICATIONS

P. Vettiger et al., "The "Millipede"—More than one thousand tips for future AFM data storage", IBM Journal of Research & Development, May 2000, p. 323-340, vol. 44, No. 3, USA.

* cited by examiner

*Primary Examiner*—Jorge L Ortiz Criado

(57) ABSTRACT

A method and apparatus for overwriting data in a probe-based data storage device wherein data is represented by the presence and absence of pits formed in a storage surface by a probe of the device is provided. Input data is first coded such that successive bits of a given value x in the coded input data ($b_0, b_1, b_2, \ldots,$) are separated by at least d bits of the complementary value $\tilde{x}$, where d is a predetermined number $\geq 2$. Overwrite data bits ($v_0, v_1, v_2, \ldots,$) are then generated by encoding the coded input data bits ($b_0, b_1, b_2, \ldots,$).

16 Claims, 7 Drawing Sheets

Figure 3

| | (2,10) coded pattern $b_i,...$ | overwrite pattern $v_i,...$ |
|---|---|---|
| 1 | 0 0 1 | 0 0 1 |
| 2 | 0 0 0 1 | 0 0 0 1 |
| 3 | 0 0 0 0 1 | 0 0 0 0 1 |
| 4 | 0 0 0 0 0 1 | 0 0 0 1 0 1 <br> 0 0 0 0 1 1 |
| 5 | 0 0 0 0 0 0 1 | 0 0 0 0 1 0 1 |
| 6 | 0 0 0 0 0 0 0 1 | 0 0 0 1 0 1 0 1 <br> 0 0 0 0 1 0 1 1 <br> 0 0 0 0 1 1 0 1 |
| 7 | 0 0 0 0 0 0 0 0 1 | 0 0 0 0 1 0 1 0 1 |
| 8 | 0 0 0 0 0 0 0 0 0 1 | 0 0 0 1 0 1 0 1 0 1 <br> 0 0 0 0 1 0 1 0 1 1 <br> 0 0 0 0 1 0 1 1 0 1 <br> 0 0 0 0 1 1 0 1 0 1 |
| 9 | 0 0 0 0 0 0 0 0 0 0 1 | 0 0 0 0 1 0 1 0 1 0 1 |

Figure 4

| | start pattern $b_i,...$ | overwrite pattern $v_i,...$ |
|---|---|---|
| 1 | 0 1 | 0 1 |
| 2 | 0 0 1 | 0 0 1 |
| 3 | 0 0 0 1 | 0 1 0 1 <br> 0 0 1 1 |
| 4 | 0 0 0 0 1 | 0 0 1 0 1 |
| 5 | 0 0 0 0 0 1 | 0 1 0 1 0 1 <br> 0 0 1 0 1 1 <br> 0 0 1 1 0 1 |
| 6 | 0 0 0 0 0 0 1 | 0 0 1 0 1 0 1 |
| 7 | 0 0 0 0 0 0 0 1 | 0 1 0 1 0 1 0 1 <br> 0 0 1 0 1 0 1 1 <br> 0 0 1 0 1 1 0 1 <br> 0 0 1 1 0 1 0 1 |
| 8 | 0 0 0 0 0 0 0 0 1 | 0 0 1 0 1 0 1 0 1 |
| 9 | 0 0 0 0 0 0 0 0 0 1 | 0 1 0 1 0 1 0 1 0 1 <br> 0 0 1 0 1 0 1 0 1 1 <br> 0 0 1 0 1 0 1 1 0 1 <br> 0 0 1 0 1 1 0 1 0 1 <br> 0 0 1 1 0 1 0 1 0 1 |
| 10 | 0 0 0 0 0 0 0 0 0 0 1 | 0 0 1 0 1 0 1 0 1 0 1 |

|   | end pattern $b_i,...$ | overwrite pattern $v_i,...$ |
|---|---|---|
| 1 | 0 | 0 |
| 2 | 0 0 | 0 0 |
| 3 | 0 0 0 | 0 0 0 1 |
| 4 | 0 0 0 0 | 0 0 0 0 1 |
| 5 | 0 0 0 0 0 | 0 0 0 1 0 1 <br> 0 0 0 0 1 1 |
| 6 | 0 0 0 0 0 0 | 0 0 0 0 1 0 1 |
| 7 | 0 0 0 0 0 0 0 | 0 0 0 1 0 1 0 1 <br> 0 0 0 0 1 0 1 1 <br> 0 0 0 0 1 1 0 1 |
| 8 | 0 0 0 0 0 0 0 0 | 0 0 0 0 1 0 1 0 1 |
| 9 | 0 0 0 0 0 0 0 0 0 | 0 0 0 1 0 1 0 1 0 1 <br> 0 0 0 0 1 0 1 0 1 1 <br> 0 0 0 0 1 0 1 1 0 1 <br> 0 0 0 0 1 1 0 1 0 1 |
| 10 | 0 0 0 0 0 0 0 0 0 0 | 0 0 0 0 1 0 1 0 1 0 1 |

Figure 5

| coded $b_i$ pattern | Method 1 overwrite pattern | Method 2 overwrite pattern | New overwrite pattern |
|---|---|---|---|
| 001 | 011 | 001 | 001 |
| 0001 | 0111 | 0011 | 0001 |
| 00001 | 01111 | 00111 | 00001 |
| 000001 | 011111 | 001111 | 000101 |
| 0000001 | 0111111 | 0011111 | 0000101 |
| 00000001 | 01111111 | 00111111 | 00010101 |
| 000000001 | 011111111 | 001111111 | 000010101 |
| 0000000001 | 0111111111 | 0011111111 | 0001010101 |
| 00000000001 | 01111111111 | 00111111111 | 00001010101 |

Figure 7

| | |
|---:|:---|
| old data | 0 1 0 0 1 0 0 1 0 0 0 1 0 0 1 0 0 1 |
| new $b_i$ sequence | 1 0 0 1 0 0 0 0 0 0 1 0 0 0 1 0 0 0 |
| overwrite ($v_i$) sequence | 1 0 0 1 0 0 0 0 1 0 1 0 0 0 1 0 0 0 1 |
| write: $v_0$ | 1 0 0 0 1 0 0 1 0 0 0 1 0 0 1 0 0 1 |
| $v_1$ | 1 0 0 0 1 0 0 1 0 0 0 1 0 0 1 0 0 1 |
| $v_2$ | 1 0 0 0 1 0 0 1 0 0 0 1 0 0 1 0 0 1 |
| $v_3$ | 1 0 0 1 0 0 0 1 0 0 0 1 0 0 1 0 0 1 |
| $v_4$ | 1 0 0 1 0 0 0 1 0 0 0 1 0 0 1 0 0 1 |
| $v_5$ | 1 0 0 1 0 0 0 1 0 0 0 1 0 0 1 0 0 1 |
| $v_6$ | 1 0 0 1 0 0 0 1 0 0 0 1 0 0 1 0 0 1 |
| $v_7$ | 1 0 0 1 0 0 0 1 0 0 0 1 0 0 1 0 0 1 |
| $v_8$ | 1 0 0 1 0 0 0 0 1 0 0 1 0 0 1 0 0 1 |
| $v_9$ | 1 0 0 1 0 0 0 0 1 0 0 1 0 0 1 0 0 1 |
| $v_{10}$ | 1 0 0 1 0 0 0 0 0 1 0 0 1 0 0 1 0 0 1 |
| $v_{11}$ | 1 0 0 1 0 0 0 0 0 0 1 0 0 0 1 0 0 1 |
| $v_{12}$ | 1 0 0 1 0 0 0 0 0 0 1 0 0 0 1 0 0 1 |
| $v_{13}$ | 1 0 0 1 0 0 0 0 0 0 1 0 0 0 1 0 0 1 |
| $v_{14}$ | 1 0 0 1 0 0 0 0 0 0 1 0 0 0 1 0 0 1 |
| $v_{15}$ | 1 0 0 1 0 0 0 0 0 0 1 0 0 0 1 0 0 1 |
| $v_{16}$ | 1 0 0 1 0 0 0 0 0 0 1 0 0 0 1 0 0 1 |
| $v_{17}$ | 1 0 0 1 0 0 0 0 0 0 1 0 0 0 1 0 0 1 |
| $v_{18}$ | 1 0 0 1 0 0 0 0 0 0 1 0 0 0 1 0 0 0 1 |

Figure 6

|  | $p_2$ | $p_3$ | $p_4$ | $p_5$ | $p_6$ | $p_7$ | $p_8$ | $p_9$ | $p_{10}$ |
|---|---|---|---|---|---|---|---|---|---|
| Code 1 | 0.291 | 0.210 | 0.154 | 0.111 | 0.081 | 0.060 | 0.046 | 0.029 | 0.018 |
| Code 2 | 0.314 | 0.252 | 0.164 | 0.106 | 0.069 | 0.044 | 0.028 | 0.018 | 0.005 |

Figure 8

|  | Simple Write | Method 1 | Method 2 | New Method |
|---|---|---|---|---|
| Code 1 | $P_w$ | $4.098 P_w$ | $3.098 P_w$ | $1.545 P_w$ |
| Code 2 | $P_w$ | $3.728 P_w$ | $2.728 P_w$ | $1.388 P_w$ |

Figure 9

|  | Method 1 | Method 2 | New Method |
|---|---|---|---|
| Code 1 | 1.0 | 0.756 | 0.377 |
| Code 2 | 1.0 | 0.732 | 0.372 |

| | d=3 coded pattern $b_i,...$ | overwrite pattern $v_i,...$ |
|---|---|---|
| 1 | 0 0 0 1 | 0 0 0 1 |
| 2 | 0 0 0 0 1 | 0 0 0 0 1 |
| 3 | 0 0 0 0 0 1 | 0 0 0 0 0 1 |
| 4 | 0 0 0 0 0 0 1 | 0 0 0 0 0 0 1 |
| 5 | 0 0 0 0 0 0 0 1 | 0 0 0 0 1 0 0 1 <br> 0 0 0 0 0 1 0 1 <br> 0 0 0 0 0 0 1 1 |
| 6 | 0 0 0 0 0 0 0 0 1 | 0 0 0 0 0 1 0 0 1 <br> 0 0 0 0 0 0 1 0 1 |
| 7 | 0 0 0 0 0 0 0 0 0 1 | 0 0 0 0 0 0 1 0 0 1 |
| 8 | 0 0 0 0 0 0 0 0 0 0 1 | 0 0 0 0 1 0 0 1 0 0 1 <br> 0 0 0 0 0 1 0 1 0 0 1 <br> 0 0 0 0 0 0 1 1 0 0 1 <br> 0 0 0 0 0 1 0 0 1 0 1 <br> 0 0 0 0 0 0 1 0 1 0 1 <br> 0 0 0 0 0 0 1 0 0 1 1 |

Figure 12

| | (2,10) coded pattern $b_i,...$, for x=0 | overwrite pattern $v_i,...$, for p=1 |
|---|---|---|
| 1 | 1 1 0 | 0 0 1 |
| 2 | 1 1 1 0 | 0 0 0 1 |
| 3 | 1 1 1 1 0 | 0 0 0 0 1 |
| 4 | 1 1 1 1 1 0 | 0 0 0 1 0 1 <br> 0 0 0 0 1 1 |
| 5 | 1 1 1 1 1 1 0 | 0 0 0 0 1 0 1 |
| 6 | 1 1 1 1 1 1 1 0 | 0 0 0 1 0 1 0 1 <br> 0 0 0 0 1 0 1 1 <br> 0 0 0 0 1 1 0 1 |
| 7 | 1 1 1 1 1 1 1 1 0 | 0 0 0 0 1 0 1 0 1 |
| 8 | 1 1 1 1 1 1 1 1 1 0 | 0 0 0 1 0 1 0 1 0 1 <br> 0 0 0 0 1 0 1 0 1 1 <br> 0 0 0 0 1 0 1 1 0 1 <br> 0 0 0 0 1 1 0 1 0 1 |
| 9 | 1 1 1 1 1 1 1 1 1 1 0 | 0 0 0 0 1 0 1 0 1 0 1 |

|                      |                       |
|---------------------:|:----------------------|
| old data             | 0 1 0 0 1 0 0 1 0 0 0 1 0 0 1 0 0 1 |
| new $b_i$ sequence   | 0 1 1 0 1 1 1 1 1 1 0 1 1 1 0 1 1 1 |
| overwrite ($v_i$) sequence | 1 0 0 1 0 0 0 0 1 0 1 0 0 0 1 0 0 0 1 |
| write: $v_0$         | 1 0 0 0 1 0 0 1 0 0 0 1 0 0 1 0 0 1 |
| $v_1$                | 1 0 0 0 1 0 0 1 0 0 0 1 0 0 1 0 0 1 |
| $v_2$                | 1 0 0 0 1 0 0 1 0 0 0 1 0 0 1 0 0 1 |
| $v_3$                | 1 0 0 1 0 0 0 1 0 0 0 1 0 0 1 0 0 1 |
| $v_4$                | 1 0 0 1 0 0 0 1 0 0 0 1 0 0 1 0 0 1 |
| $v_5$                | 1 0 0 1 0 0 0 1 0 0 0 1 0 0 1 0 0 1 |
| $v_6$                | 1 0 0 1 0 0 0 1 0 0 0 1 0 0 1 0 0 1 |
| $v_7$                | 1 0 0 1 0 0 0 1 0 0 0 1 0 0 1 0 0 1 |
| $v_8$                | 1 0 0 1 0 0 0 1 0 0 0 1 0 0 1 0 0 1 |
| $v_9$                | 1 0 0 1 0 0 0 0 1 0 0 1 0 0 1 0 0 1 |
| $v_{10}$             | 1 0 0 1 0 0 0 0 0 1 0 0 0 1 0 0 1 |
| $v_{11}$             | 1 0 0 1 0 0 0 0 0 1 0 0 0 1 0 0 1 |
| $v_{12}$             | 1 0 0 1 0 0 0 0 0 0 1 0 0 0 1 0 0 1 |
| $v_{13}$             | 1 0 0 1 0 0 0 0 0 1 0 0 0 1 0 0 1 |
| $v_{14}$             | 1 0 0 1 0 0 0 0 0 0 1 0 0 0 1 0 0 1 |
| $v_{15}$             | 1 0 0 1 0 0 0 0 0 0 1 0 0 0 1 0 0 1 |
| $v_{16}$             | 1 0 0 1 0 0 0 0 0 0 1 0 0 0 1 0 0 1 |
| $v_{17}$             | 1 0 0 1 0 0 0 0 0 0 1 0 0 0 1 0 0 1 |
| $v_{18}$             | 1 0 0 1 0 0 0 0 0 0 1 0 0 0 1 0 0 1 |

Figure 13

DATA OVERWRITING IN PROBE-BASED DATA STORAGE DEVICES

CROSS REFERENCE TO RELATED APPLICATIONS

This application is a continuation of co-pending PCT patent application PCT/IB2003/002542, filed Jun. 13, 2003.

FIELD OF THE INVENTION

This invention relates generally to probe-based data storage devices, and more particularly to overwriting of data in such devices. Embodiments of the invention provide methods and apparatus enabling data to be stored in such devices without first erasing previously-written data.

BACKGROUND OF THE INVENTION

Probe-based data storage has long been recognized as a possible basis for ultrahigh density data storage. In probe-based data storage devices, stored data is represented on a storage surface by the presence and absence of indentations, or "pits", which are formed in the surface by a probe of the device. For example, in AFM (Atomic Force Microscope)-based storage devices, the probe is a nanometer-sharp tip mounted on the end of a microfabricated cantilever. This tip can be moved over the surface of a storage medium in the form of a polymer substrate. A mechanism is provided for heating the tip, and thus the polymer surface at the point of contact with the tip, allowing the tip to penetrate the surface to create a pit. Such a pit typically represents a bit of value "1", a bit of value "0" being represented by the absence of a pit at a bit position on the storage surface. In a read-scan mode, the thermomechanical probe mechanism can be used to read-back data by detecting the deflection of the cantilever as the tip is moved over the pattern of bit indentations. AFM-based data storage is described in detail in IBM Journal of Research & Development, Volume 44, No. 3, May 2000, pp323-340, "The 'Millipede'—More Than One Thousand Tips for Future AFM Data Storage", Vettiger et al., and the references cited therein. As described in this document, while basic read/write operations can be implemented using a single cantilever probe, in practice an integrated array of individually-addressable cantilevers is employed in order to increase data rates.

A basic write operation in these probe-based storage devices thus involves creation of a pit in the storage surface by a micromechanical probe mechanism. As the pit is created, material is displaced by the probe and deposited in the area around the indentation. In the AFM-based device discussed above for example, melted polymer is deposited in the area around a pit creating "donut walls", or "rings", which have a higher topological profile than the polymer background. If a pit is formed sufficiently near to an existing pit, the displaced material can partly fill the existing pit, effectively changing a "1" to a "0" and thus erasing the "1". The physical mechanism exploited for probe-based data storage thus imposes a limit on the smallest distance between pits created during a data write operation. This minimum distance $T_{min}$ is the smallest distance between adjacent pits created during a write operation for which writing the second pit will not erase the first pit due to displacement of material. For basic data write operations this limit $T_{min}$ translates into a minimum allowable distance between stored data bits.

When overwriting of old data with new data is contemplated in probe-based storage devices, certain difficulties arise as a consequence of the mechanism employed for data storage. For example, since a zero corresponds to "no pit" at a bit position, writing a zero at a bit position corresponds to no action. Hence, "writing" a zero over a previously-written "1" at a bit position will leave the "1" in tact, rendering the newly-written data incorrect. Because of such problems, prior to our copending European Patent Application No. 02010648.0 filed 13 May 2002, probe-based data storage relied on the writing of data on "clean" storage surfaces, i.e. surfaces on which data has not previously been written or from which old data has been erased. For example, in the case of the Millipede device discussed earlier, old data can be erased by heating the storage surface to cause melting and "reflow" of the polymer. However, erasing of old data is clearly a power and time intensive process. In our European patent application referenced above, a system is disclosed which allows direct overwriting of old data with new data in probe-based data storage devices. This system effectively involves a two-stage coding process. In the first stage, input data is coded to prevent occurrence of two consecutive bits of a given value "x" in the coded input data. If x=1 for example, then the coding ensures that successive "1's" in the coded input data are separated by at least "d" zeros, where d is a predetermined number≧1. The effect of this coding is to ensure that successive pits to be left in the storage surface after a write operation are always separated by at least one "no-pit". This coding therefore allows the stored bit density to be increased over the uncoded case where the minimum bit spacing is constrained to $T_{min}$ as explained above. In the second coding stage, an algorithm is employed to generate an overwrite bit sequence from the coded input bit sequence. In simple terms, the algorithms employed here are based on the premise that writing a pit can erase an existing, neighboring pit on either side of the new pit due to displacement of material as discussed above. When the resulting overwrite bit sequence is written on the storage surface, the effect is to record either the original coded input bit sequence, or the complement of this bit sequence, depending on particular operating parameters. This result is independent of the bit values of the old data which is overwritten, and hence erasing of old data is not required.

The power expenditure in any data write operation in probe-based storage devices is directly related to the number of pits formed in the storage surface. From the principles underlying the overwrite system outlined above, it follows that writing an overwrite sequence generated from a given coded input bit sequence necessarily involves writing more pits than would writing the coded input bit sequence directly (though the latter operation would not of course allow overwriting of old data). The overwrite operation thus requires more power for given input data than a conventional write operation on a clean storage surface. Power consumption, always an important consideration, is thus a more prominent factor where direct-overwrite capability is provided. The present invention enables direct overwriting to be achieved with reduced power consumption compared to methods disclosed in our European patent application referenced above.

SUMMARY OF THE INVENTION

According to one aspect of the present invention there is provided a method for overwriting data in a probe-based data storage device wherein data is represented by the presence and absence of pits formed in a storage surface by a probe of the device. The method includes coding input data such that successive bits of a value x in the coded input data are separated by at least d bits of value x̃, where d is a predetermined number≧2. Also, the method includes generating overwrite data bits. Moreover, the method includes overwriting data on the storage surface with the overwrite data bits at a bit spacing such that writing an overwrite data bit of value p can erase an existing bit of value p within d bits of that overwrite data bit.

In another embodiment, an apparatus for coding data for storage in a probe-based data storage device wherein data is represented by the presence and absence of pits formed in a storage surface by a probe of the device is provided. The apparatus includes a coder for coding input data to be stored in the device such that successive bits of a value x in the coded input data are separated by at least d bits of value $\tilde{x}$, where d is a predetermined number$\geq$2. In addition, the apparatus includes an overwrite pattern generator for generating overwrite data bits by encoding the coded input data bits.

In another embodiment, a coding apparatus for coding data for storage in a probe-based data storage device wherein data is represented by the presence and absence of pits formed in a storage surface by a probe of the device is provided. The coding apparatus includes a coder for coding input data to be stored in the device such that successive bits of a value x in the coded input data are separated by at least d bits of value $\tilde{x}$, where d is a predetermined number$\geq$2. Also, the coding apparatus includes an overwrite pattern generator for generating overwrite data bits by encoding the coded input data bits.

BRIEF DESCRIPTION OF THE DRAWINGS

FIGS. 3, 4 and 5 are tables illustrating encoding schemes which can be implemented in the overwrite pattern generator of FIG. 1 where d=2.

FIG. 6 illustrates an overwrite operation in the FIG. 1 device using an encoding scheme embodying the invention.

FIG. 7 is a table comparing an encoding scheme embodying the invention with two encoding schemes disclosed in our earlier European patent application referenced above.

FIG. 8 tables run-length probabilities for two encoding methods from our earlier application.

FIGS. 9 and 10 are tables comparing an embodiment of the invention with the two encoding methods from our earlier application.

FIG. 11 is a table illustrating encoding schemes which can be implemented in the overwrite pattern generator of FIG. 1 where d=3.

FIG. 12 is a table illustrating encoding schemes for use in an alternative embodiment where the bit value x=0.

FIG. 13 illustrates an overwrite operation for the alternative embodiment of FIG. 12.

DETAILED DESCRIPTION

Figure 1:
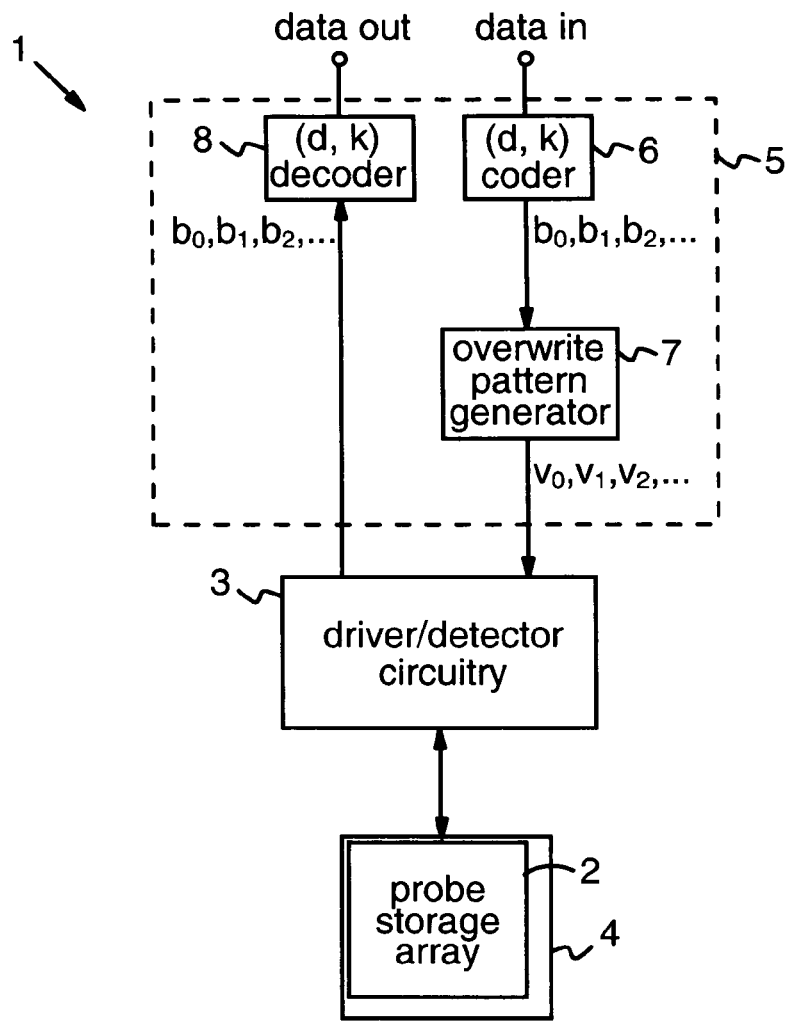
FIG. 1 is a schematic block diagram of a probe-based data storage device embodying the invention.

FIG. 1 shows a probe-based storage device 1 embodying the invention. The device 1 includes a probe-storage mechanism which, in this embodiment, comprises a Millipede probe-storage array 2, with associated array driver & detector circuitry 3, of the type described in the document referenced above. Under control of driver/detector circuitry 3, the probe array 2 can thus be used to write and read data on the surface of a polymer storage medium 4. The device 1 also includes coding/decoding apparatus which is indicated generally at 5. The coding portion of coding/decoding apparatus 5 consists of a (d, k) coder 6 and an overwrite pattern generator 7 connected as shown between the data input and the array driver/detector circuitry 3. The decoding portion of coding/decoding apparatus 5 consists of a (d, k) decoder 8 connected between the driver/detector circuitry 3 and the data output.

In operation of the device, input data to be stored is supplied to (d, k) coder 6 which implements a (d, k) code with $d \geq 2$ to generate coded input data bits $b_0, b_1, b_2, \ldots$, etc. The (d, k) coder can be implemented in known manner, the (d, k) code applied ensuring that successive bits of a particular value x in the coded input data are separated by at least d and at most k bits of value $\tilde{x}$, where $k \geq d$. The (d, k) coded input data $b_0, b_1, b_2, \ldots$, is supplied to overwrite pattern generator 7 which implements an encoding scheme described further below to generate an overwrite bit sequence $v_0, v_1, v_2, \ldots$, etc. This overwrite data $v_0, v_1, v_2, \ldots$, is output to array driver circuitry 3 which drives probe array 2 to write the overwrite data on the storage surface 4 with a bit spacing as discussed below.

In the present embodiment, it is assumed that pit formed in the storage surface 4 represents a bit of value "1" (i.e. p=1). Thus, a "1" in the overwrite data supplied to circuitry 3 is written as a pit on storage surface, a "0" in the overwrite data corresponding to "no-pit". In addition, it is assumed that x=1 in the (d, k) coding process, so that the (d, k) constraints apply to numbers of zeros and successive 1's in the coded input data $b_0, b_1, b_2, \ldots$, are separated by at least d and at most k zeros. While, in general, any code which imposes a $d \geq 2$ constraint will allow operation of overwrite methods embodying the invention, particular examples of (d, k) codes which may be employed here are the two rate 8/16 (2, 10) codes detailed in our earlier European patent application referenced above, the content of which application is incorporated herein by reference. The following description of operation of the present embodiment will thus focus on the example of a (2, 10) code.

Figure 2:
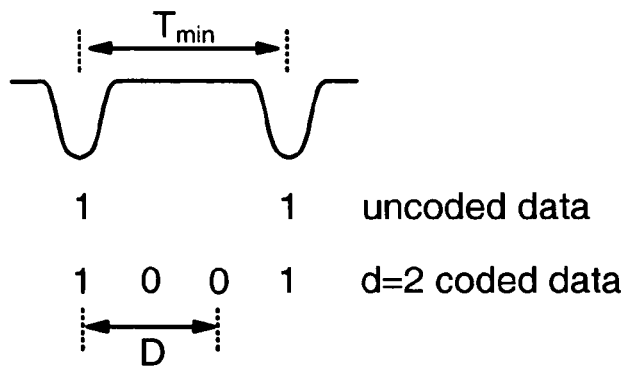
FIG. 2 illustrates the principle of the increased surface bit-density available when a d=2 code is utilized in the FIG. 1 embodiment.

In operation of the embodiment, the effect of the d=2 constraint is that successive pits to be left in the storage surface after a write operation will be separated by at least two "no-pits". This allows the surface bit density to be increased compared to that for uncoded data as illustrated schematically in FIG. 2. This figure shows two successive pits formed in storage surface 4 at the minimum possible spacing $T_{min}$ (i.e. the minimum distance at which writing the second pit will not erase the first pit due to displacement of material). For uncoded data, where adjacent "1's" can occur in the bit sequence, $T_{min}$ thus represents the minimum possible bit spacing for writing data on the storage surface. With a d=2 constraint however, successive "1's" will always be separated by at least two "0's", so the minimum bit spacing is reduced to $T_{min}/3$ as illustrated. At this bit spacing, it follows that writing an overwrite bit of value 1 will erase a previously-written "1" within ±2 bit positions of the newly-written overwrite bit due to displacement of material. It is this effect which is exploited in the overwrite system to be described. Thus, the bit-spacing utilized for write operations in the present embodiment is such that writing a "1" will erase a previously-written "1" within ±2 bit positions of the newly-written "1". Note that this bit spacing need not be the minimum possible bit spacing for d=2. While the minimum bit spacing is ideally employed in order to achieve maximum data storage density, it actually suffices that the distance D marked in FIG. 2 is less than $T_{min}$. More generally, for any value of $d \geq 2$ in overwrite systems embodying the invention, the bit spacing employed in the overwrite operation is such that writing an overwrite data bit of value p can erase an existing bit of value p within d bits of the newly-written overwrite bit. For maximum data storage density, it will generally be desirable to use the minimum possible bit spacing of $T_{min}/(d+1)$.

The encoding schemes which can be implemented in the overwrite pattern generator 7 for the (2, 10) code will now be described with reference to FIGS. 3 to 5. In FIG. 3, the left-hand column of the table shows the nine basic run patterns which can appear in the coded input data $b_i, \ldots$ when a (2, 10) code is employed in coder 6. Each of these patterns consists of a run of L zeros, where $2 \leq L \leq 10$, terminated by a "1". The right-hand column of the table shows the overwrite patterns $v_i, \ldots$ which can be used by overwrite pattern generator 7 for encoding each of these $b_i$-patterns. For the $b_i$-patterns numbered 1 to 3 and odd-numbered patterns thereafter, the overwrite patterns are unique. For the remaining $b_i$-patterns, there is a choice of $v_i$-patterns which can be used in overwrite pattern generator 7. According to the encoding rules implemented in the overwrite pattern generator, a bit of value x in the coded input data $b_i, \ldots$ is always encoded as an overwrite bit of value p, where in this embodiment x=p=1. Thus the "1"s" at the end of the $b_i$-patterns in the table are encoded as "1"s" at the end of the corresponding $v_i$-patterns, as demarcated by the broken lines in the columns. The remaining part of each $b_i$-pattern is a run of L zeros, and these runs are encoded such that one of two conditions is satisfied depending on the value of L. If $L \leq 2d$, i.e. if $L \leq 4$ in this case, then the run of L zeros in the $b_i$-pattern is encoded as a run of L zeros in the $v_i$-pattern. In this example therefore, the first three overwrite patterns in the table are identical to the corresponding $b_i$-patterns. For the remaining $b_i$-patterns L>2d, and the runs of L zeros are encoded according to a different rule. Each of these runs is encoded as a run of L overwrite bits consisting of n "1"s" and (L−n) zeros, where the number n is given by n=CEIL[(L−2d)/d]. It will be appreciated by those skilled in the art that "CEIL" is a representation of the well-known "Ceiling Function". Thus: for $2d<L \leq 3d$, n=1; for $3d<L \leq 4d$, n=2; and so on. Moreover, the position of the n "1"s" in the run of overwrite bits is important. Consideration of the runs shown in the table shows that, in all cases: there is a "1" within d bits of the end of the run; there is a "1" within 2d+1 bits of the beginning of the run; and if n>1, each of the n "1"s" is within d bits of another of the n "1"s".

The $v_i$-patterns of FIG. 3 apply where the corresponding $b_i$-patterns are preceded by a "1" in the coded input data sequence, so that the runs of L zeros in the $b_i$-patterns are bounded runs. This will usually be the case since the preceding $b_i$-pattern in the coded input data sequence will terminate in a "1". However, the coded input data may start with a run of zeros which is not preceded by a "1", and/or may end with a run of zeros which is not terminated by a "1". The encoding conditions for such start and end patterns will be explained below, but it is useful first to consider the basic patterns of FIG. 3 since the operating principle of the overwrite system can be seen from these patterns. The bits of a $v_i$-pattern output by overwrite pattern generator 7 will be written sequentially on storage surface 4, starting with the left-hand bit in the FIG. 3 representation, and old data may be overwritten in this process. Recall that the bit spacing for the write operation is such that writing a "1" will erase a previously-written "1" within d bits, here 2 bits, of the newly-written "1". Thus, the first two bits of a $v_i$-pattern in FIG. 3 can always be zero since any "1" in the old data at these bit positions will have been erased by writing the terminal 1 of the preceding $v_i$-pattern. It can also be seen that the "1"s" are positioned in the $v_i$-patterns such that, as writing of a $v_i$-pattern continues, any "1"s" in the old data being overwritten will be erased by one of the "1"s" in the $v_i$-pattern. Moreover, where there is more than one "1" in the $v_i$-pattern, all but the terminal "1" will be erased by writing a subsequent "1" in the $v_i$-pattern. The resulting bit pattern recorded on the storage surface will thus be the appropriate $b_i$-pattern.

The possible $b_i$-patterns at the start of a coded input data sequence for a write operation are shown in FIG. 4 together with the corresponding $v_i$-patterns which can be used in overwrite pattern generator 7. For the $b_i$-patterns 1 and 2 and even-numbered patterns thereafter, the overwrite patterns are unique, whereas, for the remaining $b_i$-patterns, there is a choice of $v_i$-patterns which can be used in overwrite pattern generator 7. Each of the $b_i$-patterns consists of a run of L zeros, where $1 \leq L \leq 10$, terminated by a "1". According to the general rule that "1"s" in the coded input data are always encoded as "1"s" in the overwrite data, the "1"s" at the end of the $b_i$-patterns in the figure are encoded as "1"s" at the end of the corresponding $v_i$-patterns, as demarcated by the broken lines in the columns. The remaining part of each $b_i$-pattern is a run of L zeros, and these runs are not bounded runs since there is no preceding $b_i$-pattern which terminates in a "1". These L-bit runs are encoded in the $v_i$-patterns such that one of two conditions is satisfied depending on the value of L. For $L \leq d$, i.e. $L \leq 2$ here, the run is encoded as a run of L zeros in the $v_i$-pattern. However, each run for which L>d is encoding as a run of L overwrite data bits consisting of m "1"s" and (L−m) zeros, where m=CEIL[(L−d)/d]. Thus for $d<L \leq 2d$, m=1; for $2d<L \leq 3d$, m=2; and so on. In addition, consideration of these L-bit runs in the $v_i$-patterns shows that, in each case, the m bits are positioned so that: there is a "1" within d bits of the end of the run; there is a "1" within d+1 bits of the beginning of the run; and, for m>1, each of the m bits is within d bits of another of the m bits. Comparing the resulting $v_i$-patterns for $b_i$-patterns 3 to 10 here with those for the same $b_i$-patterns in FIG. 3 shows that the $v_i$-patterns in FIG. 4 contain an extra "1" within d+1 bits of the beginning of the pattern. This is to deal with the fact that a "1" in old data overwritten by the first two bits of the $v_i$-pattern will not have been erased by a preceding $v_i$-pattern, since the current $v_i$-pattern is the beginning of the overwrite data sequence.

Insofar as the coded input data sequence for a write operation may end with a $b_i$-pattern other than those of FIG. 3, the possible end-patterns are shown in FIG. 5 together with the corresponding $v_i$-patterns which can be used in overwrite pattern generator 7. Each of these $b_i$-patterns consists of a run of L zeros, where $1 \leq L \leq 10$, and once again these runs are not bounded runs since there is no terminal "1" in this case. The conditions for encoding these runs in the $v_i$-patterns again depends on the value of L. If $L \leq d$, i.e. $L \leq 2$ here, the run is encoded in the $v_i$-pattern as a run of L zeros. However, runs 3 to 10 in FIG. 5 (for which L>d) are encoded identically to $b_i$-patterns 2 to 9 respectively of FIG. 3. As a consequence, $v_i$-patterns 3 to 10 in FIG. 5 contain an extra bit compared to their corresponding $b_i$-patterns. This extra bit is the "1" at the end of the pattern and is required to ensure that the resulting recorded bit pattern, excluding the extra bit itself, is the correct $b_i$-pattern.

The tables of FIG. 3 to 5 give all the possible $v_i$-patterns which can be utilized in overwrite pattern generator 7 for the (2, 10) code and which contain the minimal possible number of "1"s" necessary to achieve direct overwriting. Where the $v_i$-pattern for a given $b_i$-pattern is not unique, any one of the equivalent $v_i$-patterns can be used, so that a different $v_i$-pattern might be used for the same $b_i$-pattern at different times. For simplicity of implementation, however, the overwrite pattern generator will generally be configured to encode a given $b_i$-pattern as a given $v_i$-pattern. In a preferred embodiment, therefore, the overwrite pattern generator 7 encodes each $b_i$-pattern in FIGS. 3 to 5 as the corresponding $v_i$-pattern which is listed first in the tables where there is a choice. These $v_i$-patterns contain a simple repeating "01" sequence as shown in the figures. As the coded input data is received in operation, the overwrite pattern generator 7 operates as a kind of look-ahead encoder in that it finds the position of each successive "1" in the input bit stream. Each "1" marks the end of the current $b_i$-pattern, this being encoded as the appropriate $v_i$-pattern which is then output to the array driver 3. If there is no "1" at the end of the coded input data for a write operation, the overwrite pattern generator uses the appropriate $v_i$-pattern from FIG. 5 as the last $v_i$-pattern. In some embodiments, the overwrite pattern generator may be implemented in software, and suitable software will be apparent to those skilled in the art from the description herein. In other embodiments, the overwrite pattern generator may be implemented in hardware or a combination of hardware and software, e.g. by hardwired logic gates or as a lookup table for example.

FIG. 6 demonstrates the overwrite operation by way of a worked example for the case where the $v_i$-patterns used in overwrite pattern generator 7 are the first-listed patterns in FIGS. 3 to 5. The bit sequence at the top of this figure represents an old data pattern which is to be overwritten. The second bit sequence represents a new data pattern to be recorded, i.e. the coded input data $b_0, b_1, b_2, \ldots$, output by (d, k) coder 6. The third bit sequence is the overwrite pattern $v_0, v_1, v_2, \ldots$, generated by overwrite pattern generator 7 from the coded input data. In this simplistic example, the data to be recorded consists of only 18 bits, though in practice a line of data for a write operation will typically be much longer. Each of the nineteen bit patterns beneath the overwrite sequence in the figure shows the bit pattern as recorded on the storage surface after writing successive bits of the overwrite sequence. Thus, the first of these shows the recorded pattern after $v_0$ is written, the second shows the recorded pattern after $v_1$ is written, and so on. In each pattern, the newly-written bit is shown in bold. Since writing a "1" can erase a previously-written "1" within ±2 bits of the write position, each write operation can potentially affect the values of five consecutive bits (decreasing to three consecutive bits towards the beginning and end of the write sequence) within the area bounded by broken lines in the figure. As the write operation progresses, the old data is gradually transformed into the new $b_i$ sequence. Once the extra bit $v_{18}$ at the end of the overwrite sequence has been written, it can be seen that the recorded 18-bit sequence prior to this extra bit is the required $b_i$ sequence. Note from this example that it can never be necessary to erase two "1's" both to the left or both to the right of the write position, since two consecutive "1's" are prohibited by the (d, k) code. Also, when a "1" is written at the position of an existing "1", then the two existing bits on each side of this position are necessarily zeros, so that no bits need to be erased in this situation.

With regard to the extra bit required in some cases, in practice guard bands will typically be provided around writable sectors on the storage medium to ensure there is space at the beginning and end of a row and avoid interference between data in different sectors. When data is read-back from the storage medium, extra bits in guard bands are ignored, and the $b_i$ sequence is simply supplied by detector circuitry 3 to the (d, k) decoder 8. This decoder implements the inverse of the (d, k) code performed by coder 6, whereby the original input data is recovered as output data.

It will be seen that the above system allows old data to be directly overwritten, avoiding the need to erase data before a write operation. Moreover, this is achieved with substantially less power expenditure than with methods disclosed in our earlier European patent application referenced above. That application describes two basic overwrite methods, referred to in the application as "method 1" and "method 2". The overwrite patterns generated by those methods for the basic $b_i$-patterns of FIG. 3 are listed in the table of FIG. 7. The last column of this table lists the overwrite patterns for the simple embodiment of the present invention discussed above. Comparison of these patterns shows that the new technique provides overwrite patterns containing far fewer "1's" than those of the earlier methods. Indeed, the new overwrite patterns contain the minimum possible number of "1's" required to achieve direct overwriting. This translates to optimal power consumption in the overwrite operation. The significance of the power saving here is demonstrated by the following analysis.

Let $P_w$ be the power required for a single write operation (i.e. writing a single "1" in the above example), and $p_i$ be the probability of a run-length of i consecutive zeros both preceded and followed by a "1" (i.e. a bounded run of i zeros). Taking the (2, 10) code discussed above as an example, then, from FIG. 7, the average power dissipation for each the three methods is given by:

$$P_{method1} = P_w \sum_{i=2}^{10} i \cdot p_i \quad (1)$$

$$P_{method2} = P_w \sum_{i=2}^{10} (i-1) p_i \quad (2)$$

$$P_{new} = P_w(p_2 + p_3 + p_4 + 2p_5 + 2p_6 + 3p_7 + 3p_8 + 4p_9 + 4p_{10}) \quad (3)$$

The power required for any particular overwrite method should be measured against the corresponding power for a basic write operation on a clean storage surface. The power required for such a basic write operation is:

$$P_{write} = P_w \sum_{i=2}^{10} 1 \cdot p_i = P_w \quad (4)$$

since $$\sum_{i=2}^{10} p_i = 1.$$

The reduction in power dissipation through using one method over another can be quantified by the "power dissipation reduction factor" $f_{A,B}$, where:

$$f_{A,B} = \frac{P_{methodA}}{P_{methodB}} \quad (5)$$

The power advantages of one method over another depend on the run-length probabilities of the specific code used. The run-length probabilities have been estimated for the two rate 8/16 (2,10) codes disclosed in our earlier application (referred to as "Code 1" and "Code 2") and shown in the table of FIG. 8. Based on these probabilities, the power dissipation of the various methods for both codes is indicated in the table of FIG. 9. The power dissipation reduction factors for the three overwrite methods, with Method 1 as a reference, are shown in the table of FIG. 10. It can be seen from these tables that, when using Code 2 for example, Method 2 requires 73.2% of the power required by Method 1, whereas the new method requires only 37.2% of this power. Compared to a simple write operation on a clean substrate, the new method requires only about 39% more power, whereas Method 2 requires about 173% more power. The new overwrite system thus offers a dramatic saving in power consumption over the earlier overwrite methods.

While operation of the overwrite system has been illustrated above for a (2,10) code, by applying the general encoding rules for generating overwrite patterns the system can be employed with any $d \geq 2$ code. By way of example, FIG. 11 shows the overwrite patterns for basic $b_i$-patterns (equivalent to those of FIG. 3) with a d=3 code. These can of course be continued for any value of k. Indeed, while the k-constraint is desirable for timing recovery purposes, a k constraint is not in theory necessary for operation of the overwrite technique. In addition, while the value x=p=1 in the above example, the system can be applied with either value of x and either value of p using the generalized rules set out earlier. By way of example, FIG. 12 shows the equivalent table to FIG. 3 for an alternative embodiment in which x=0 and p=1. In embodiments where x=p, whether this value is "0" or "1", the result of an overwrite operation is to record the coded input data $b_0$, $b_1$, $b_2$, ..., on the storage surface as in the example above. However, where x=$\tilde{p}$ as in FIG. 12, then the overwrite operation will record the complement of the coded input data, i.e. $\tilde{b}_0$, $\tilde{b}_1$, $\tilde{b}_2$. This is demonstrated in FIG. 13 which shows the equivalent example to FIG. 6 but in which it is assumed that x=0 and p=1. Thus, in embodiments where x=$\tilde{p}$, an inverter is provided between drive circuitry 3 and decoder 8 in FIG. 1, whereby data read from the storage surface is decoded by taking the complement of this data and then performing the inverse (d, k) coding.

While the storage device 1 employs a Millipede probe storage array in the particular embodiment described, different probe mechanisms may be employed in other probe-based storage devices embodying the invention. Moreover, embodiments of the invention could use write-pattern selection as described in our earlier application, whereby a controller selects either the overwrite data or the coded input data as the write pattern depending on whether the write pattern is to overwrite old data or is to be written on a clean area of the storage surface. However, since embodiments of the invention have reduced overwrite power requirements comparable to those for basic write operations on clean surfaces, write-pattern selection is less relevant here, and the simple system described above will generally be preferred. Many other changes and modifications can of course be made to the specific embodiments described above without departing from the scope of the invention.

What is claimed is:

1. A method for overwriting data in a probe-based data storage device wherein data is represented by the presence and absence of pits formed in a storage surface by a probe of the device, the method comprising:
   coding input data such that successive bits of a value x in the coded input data ($b_0$, $b_1$, $b_2$, ...,) are separated by at least d bits of value $\tilde{x}$, where d is a predetermined number$\geq 2$;
   generating overwrite data bits ($v_0$, $v_1$, $v_2$, ...,) by encoding the coded input data bits ($b_0$, $b_1$, $b_2$, ...,) such that, if a pit represents a bit of value p in the data storage device, then:

(a) any bit of value x in the coded input data ($b_0$, $b_1$, $b_2$, ...,) is encoded as an overwrite data bit of value p;

(b) any bounded run of $L \leq 2d$ bits of value $\tilde{x}$ in the coded input data ($b_0$, $b_1$, $b_2$, ...,) is encoded as a run of L overwrite data bits of value $\tilde{p}$; and (c) any bounded run of L>2d bits of value $\tilde{x}$ in the coded input data ($b_0$, $b_1$, $b_2$, ...,) is encoded as a run of L overwrite data bits consisting of n bits of value p and (L−n) bits of value $\tilde{p}$ where n=CEIL[(L−2d)/d] and the n bits are positioned in the run such that:

(c1) there is a bit of value p within d bits of the end of the run;

(c2) there is a bit of value p within 2d+1 bits of the beginning of the run; and (c3) for n>1, each of the n bits is within d bits of another of the n bits; and overwriting data on the storage surface with the overwrite data bits ($v_0$, $v_1$, $v_2$, ...,) at a bit spacing such that writing an overwrite data bit of value p can erase an existing bit of value p within d bits of that overwrite data bit.

2. The method of claim 1 wherein p=1.

3. The method of claim 1 wherein x=1.

4. The method of claim 1 wherein d=2.

5. The method of claim 1 wherein the input data is coded such that successive bits of a value x in the coded input data ($b_0$, $b_1$, $b_2$, ...,) are separated by at least d and at most k bits of value $\tilde{x}$, where k is a predetermined number>d.

6. The method of claim 5 wherein d=2 and k=10.

7. An apparatus for coding data to be stored in a probe-based data storage device, wherein data is represented by the presence and absence of pits formed in a storage surface by a probe of the device, the apparatus comprising:
   a coder for coding input data to be stored in the device such that successive bits of a value x in the coded input data ($b_0$, $b_1$, $b_2$, ...,) are separated by at least d bits of value $\tilde{x}$, where d is a predetermined number$\geq 2$; and
   an overwrite pattern generator for generating overwrite data bits ($v_0$, $v_1$, $v_2$, ...,) by encoding the coded input data bits ($b_0$, $b_1$, $b_2$, ...,) such that:

(a) any bit of value x in the coded input data ($b_0$, $b_1$, $b_2$, ...,) is encoded as an overwrite data bit of value x;

(b) any bounded run of $L \leq 2d$ bits of value $\tilde{x}$ in the coded input data ($b_0$, $b_1$, $b_2$, ...,) is encoded as a run of L overwrite data bits of value $\tilde{x}$; and (c) any bounded run of L>2d bits of value $\tilde{x}$ in the coded input data ($b_0$, $b_1$, $b_2$, ...,) is encoded as a run of L overwrite data bits consisting of n bits of value x and (L−n) bits of value $\tilde{x}$ where n=CEIL[(L−2d)/d] and the n bits are positioned in the run such that:

(c1) there is a bit of value x within d bits of the end of the run;

(c2) there is a bit of value x within 2d+1 bits of the beginning of the run; and (c3) for n>1, each of the n bits is within d bits of another of the n bits.

8. An apparatus for coding data for storage in a probe-based data storage device wherein data is represented by the presence and absence of pits formed in a storage surface by a probe of the device, the apparatus comprising:
   a coder for coding input data to be stored in the device such that successive bits of a value x in the coded input data ($b_0$, $b_1$, $b_2$, ...,) are separated by at least d bits of value $\tilde{x}$, where d is a predetermined number$\geq 2$;
   an overwrite pattern generator for generating overwrite data bits ($v_0$, $v_1$, $v_2$, ...,) by encoding the coded input data bits ($b_0$, $b_1$, $b_2$, ...,) such that:

(a) any bit of value x in the coded input data ($b_0$, $b_1$, $b_2$, . . . ,) is encoded as an overwrite data bit of value $\tilde{x}$;

(b) any bounded run of L≦2d bits of value $\tilde{x}$ in the coded input data ($b_0$, $b_1$, $b_2$, . . . ,) is encoded as a run of L overwrite data bits of value x; and (c) any bounded run of L>2d bits of value $\tilde{x}$ in the coded input data ($b_0$, $b_1$, $b_2$, . . . ,) is encoded as a run of L overwrite data bits consisting of n bits of value $\tilde{x}$ and (L−n) bits of value x where n=CEIL[(L−2d)/d] and the n bits are positioned in the run such that:

(c1) there is a bit of value $\tilde{x}$ within d bits of the end of the run;

(c2) there is a bit of value $\tilde{x}$ within 2d+1 bits of the beginning of the run; and (c3) for n>1, each of the n bits is within d bits of another of the n bits.

9. The apparatus of claim 8 further comprises a decoder for decoding data read from the storage surface, the decoder being arranged to implement the inverse of the code implemented by said coder.

10. A Probe-based data storage apparatus comprising:

a storage surface;

a probe mechanism for storing data on the storage surface by forming pits therein such that data is represented by the presence and absence of pits at bit locations on the surface;

a coder for coding input data to be stored in the device such that successive bits of a value x in the coded input data ($b_0$, $b_1$, $b_2$, . . . ,) are separated by at least d bits of value $\tilde{x}$, where d is a predetermined number≧2;

an overwrite pattern generator for generating overwrite data bits ($v_0$, $v_1$, $v_2$, . . . ,) by encoding the coded input data bits ($b_0$, $b_1$, $b_2$, . . . ,) such that, if a pit represents a bit of value p then:

(a) any bit of value x in the coded input data ($b_0$, $b_1$, $b_2$, . . . ,) is encoded as an overwrite data bit of value p;

(b) any bounded run of L≦2d bits of value $\tilde{x}$ in the coded input data ($b_0$, $b_1$, b2, . . . ,) is encoded as a run of L overwrite data bits of value $\tilde{p}$; and (c) any bounded run of L>2d bits of value $\tilde{x}$ in the coded input data ($b_0$, $b_1$, $b_2$, . . . ,) is encoded as a run of L overwrite data bits consisting of n bits of value p and (L−n) bits of value $\tilde{p}$ where n=CEIL[(L−2d)/d] and the n bits are positioned in the run such that:

(c1) there is a bit of value p within d bits of the end of the run;

(c2) there is a bit of value p within 2d+1 bits of the beginning of the run; and (c3) for n>1, each of the n bits is within d bits of another of the n bits, whereby, the probe mechanism is arranged, in use, to overwrite data on the storage surface with the overwrite data bits ($v_0$, $v_1$, $v_2$, . . . ,) at a bit spacing such that writing an overwrite data bit of value p can erase an existing bit of value p within d bits of that overwrite data bit.

11. The apparatus of claim 10 wherein p=1.

12. The apparatus of claim 10 wherein the probe mechanism comprises a plurality of individually-addressable probes for writing data on the storage surface.

13. The apparatus of claim 10 wherein x=1.

14. The apparatus of claim 10 wherein d=2.

15. The apparatus of claim 10 wherein the coder is arranged to code the input data such that successive bits of a value x in the coded input data ($b_0$, $b_1$, $b_2$, . . . ,) are separated by at least d and at most k bits of value $\tilde{x}$, where k is a predetermined number>d.

16. The apparatus of claim 15 wherein d=2 and k=10.

* * * * *

UNITED STATES PATENT AND TRADEMARK OFFICE
CERTIFICATE OF CORRECTION

PATENT NO. : 7,646,693 B2
APPLICATION NO. : 11/015823
DATED : January 12, 2010
INVENTOR(S) : Antonakopoulos et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1325 days.

Signed and Sealed this

Sixteenth Day of November, 2010

David J. Kappos
*Director of the United States Patent and Trademark Office*